United States Patent
Kim

(10) Patent No.: US 7,345,923 B2
(45) Date of Patent: Mar. 18, 2008

(54) WORDLINE VOLTAGE GENERATION CIRCUIT AND NONVOLATILE MEMORY DEVICE WITH THE SAME

(75) Inventor: Moo-Sung Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/321,282

(22) Filed: Dec. 29, 2005

(65) Prior Publication Data

US 2006/0274564 A1    Dec. 7, 2006

(30) Foreign Application Priority Data

Jun. 1, 2005    (KR) ............... 10-2005-0046898

(51) Int. Cl.
*G11C 16/06* (2006.01)

(52) U.S. Cl. ............... 365/185.23; 365/185.18; 365/185.19

(58) Field of Classification Search ........... 365/185.23, 365/185.18, 185.19
See application file for complete search history.

(56) References Cited

U.S. PATENT DOCUMENTS

| | | | | |
|---|---|---|---|---|
| 5,642,309 A | * | 6/1997 | Kim et al. | ............ 365/185.22 |
| 6,249,455 B1 | | 6/2001 | Kim | |
| 6,804,150 B2 | * | 10/2004 | Park et al. | ............ 365/185.18 |
| 7,038,949 B2 | * | 5/2006 | Chae et al. | ............ 365/185.23 |
| 7,158,418 B2 | * | 1/2007 | Chae et al. | ............ 365/185.23 |
| 2006/0044923 A1 | * | 3/2006 | Hahn et al. | ............ 365/230.06 |

FOREIGN PATENT DOCUMENTS

| | | |
|---|---|---|
| JP | 11-031391 | 2/1999 |
| JP | 2000-195283 | 7/2000 |
| JP | 2004-146548 | 5/2004 |
| KR | 10-2003-0089314 | 11/2003 |

\* cited by examiner

*Primary Examiner*—Connie C. Yoha
(74) *Attorney, Agent, or Firm*—F. Chau & Associates, LLC

(57) ABSTRACT

A wordline voltage generation circuit generates an incremental step pulse voltage and includes a first circuit unit connected to a program voltage, a second circuit unit connected between the first circuit unit and a divided voltage and controlled by a program step code, and a third circuit unit connected between the divided voltage and a ground voltage. An increment of the program voltage is set according to a resistance of the third circuit unit without a change in the program step code. The first circuit unit is symmetrical in structure to the third circuit unit, and an increment of the program voltage is set by controlling a relationship between a resistance of the first circuit unit and a resistance of the third circuit unit, while maintaining a start program voltage or a target program voltage at a fixed value without a change in the program step code.

36 Claims, 9 Drawing Sheets

WORDLINE VOLTAGE GENERATION CIRCUIT AND NONVOLATILE MEMORY DEVICE WITH THE SAME

CROSS-REFERENCE TO RELATED APPLICATIONS

This U.S. non-provisional patent application claims priority under 35 U.S.C. § 119 to Korean Patent Application 10-2005-46898 filed on 1 Jun. 2005.

BACKGROUND OF THE INVENTION

1. Field of the Invention

The present invention relates to a semiconductor memory device, and more particularly to a wordline voltage generation circuit and a nonvolatile memory device including the wordline voltage generation circuit.

2. Description of Related Art

A flash memory device typically includes an array of memory cells constituted by floating gate transistors. The array of memory cells includes strings of floating gate transistors, also called NAND strings. Each of the floating gate transistors is serially connected between a string selection transistor and a ground selection transistor. A plurality of wordlines are arranged to intersect the NAND strings. Each of the wordlines is connected to a control gate of a corresponding floating gate transistor of the NAND string. The floating gate transistors are the memory cells, which are erased to have a voltage of, for example, −3 V. To program a memory cell, a high voltage of, for example, 20 V, is applied to a wordline of the memory cell selected during a given time. While a program voltage of the selected memory is increased, program voltages of non-selected memory cells do not change.

An incremental step pulse programming (ISPP) method is used to substantially prevent a program error, for example, wherein the non-selected memory cells are programmed during the programming operation. In the ISPP method, a program voltage Vpgm to be applied to a selected wordline gradually increases from a low voltage to a high voltage during a program loop. The program voltage Vpgm takes the form of a pulse that has a given width and increases by $\Delta Vpgm$ as compared to a prior pulse. The given width and $\Delta Vpgm$ substantially prevent a program error due to a sudden increase in the program voltage. The distribution of the program voltage (e.g., the difference between a height of the start program voltage and a target program voltage) of the memory cell to be programmed is set to control the distribution of the program voltage. Circuits for generating a program voltage according to the ISPP scheme are disclosed in U.S. Pat. No. 5,642,309 entitled "AUTO-PROGRAM CIRCUIT IN A NONVOLATILE SEMICONDUCTOR MEMORY DEVICE."

FIG. 1 is a graph illustrating a change in a wordline voltage when a programming operation is performed using an ISPP scheme. In this document, a wordline voltage and a program voltage are used synonymously.

Referring to FIG. 1, a program voltage of the first program loop is called a start program voltage Vpgm1, and a program voltage of the m-th program loop is called a target program voltage VpgmM. As program loops of a program cycle repeat, the program voltage Vpgm gradually increases from the start program voltage Vpgm1 by a predetermined increment $\Delta Vpgm$. When a program voltage of a corresponding cell to be programmed reaches the limit of a program voltage of a target cell, it is determined that the corresponding cell has been programmed. When a non-programmed cell exists, the program loop increases. When it is determined that all the cells have been programmed, the program loop is interrupted. When all the cells are not programmed within the predetermined number of times of the program, it is determined that the corresponding block has failed to be programmed.

Memory device characteristics demanded by users have diversified with the advances in miniaturization and integration. Some users want a memory device that can be rapidly programmed, while other users attach importance to the distribution of the program voltage of the programmed memory cell. As the program operation progresses, the program voltage of the programmed cell increases by an increment $\Delta Vpgm$ set in each of program loops. Accordingly, the increment $\Delta Vpgm$ of the program voltage needs to be reduced to increase the distribution of the program voltage of the programmed memory cell. The increment $\Delta Vpgm$ needs to be increased to rapidly performing the program operation. As described above, the increment $\Delta Vpgm$ of the program voltage needs to be set differently according to the user demands.

A method of changing the increment $\Delta Vpgm$ of the program voltage operates by changing a program step code. In this method, the program step code is changed to increase resistance of a voltage divider by two steps ($2\Delta R$) rather than by one step ($\Delta R$), thereby doubling the increment $\Delta Vpgm$ of the program voltage. A separate circuit is needed for changing the program step code, resulting in an increased circuit area and a more complicated structure. Also, the increment of the program voltage can be changed only by an integer multiple of a default value. Therefore, it can be difficult to satisfy the user demands by the above method.

FIGS. 2A and 2B illustrate a case where the increment $\Delta Vpgm$ of the wordline voltage is changed without a change in the program step code. FIG. 2A is a graph illustrating a change in the wordline voltage when an increment thereof is set to a value smaller than $\Delta Vpgm$. FIG. 2B is a graph illustrating a change in the wordline voltage when the increment is set to a value larger than $\Delta Vpgm$. As illustrated in FIGS. 2A and 2B, when the increment $\Delta Vpgm$ of the wordline voltage is changed, the start program voltage and the target program voltage are changed accordingly.

Referring to FIG. 2A, a dashed line represents the wordline voltage for the increment $\Delta Vpgm$. A solid line represents the wordline voltage when the increment of the wordline voltage is reduced from $\Delta Vpgm$ to $\Delta Vpgm/K$ (where K is a real number larger than 1). As illustrated in FIG. 2A, when the increment of the program voltage is reduced, the distribution width of the memory cell decreases, and the program loop width is increased for the target program voltage of the cell reducing the program speed. When the increment $\Delta Vpgm$ of the program voltage is reduced by 1/K, the start program voltage $\Delta Vpgm1$ and the target program voltage $\Delta VpgmM$ are reduced accordingly. Referring to FIG. 2A, the start program voltage is reduced from Vpgm1 to Vpgm1', and the target program voltage is reduced from VpgmM to VpgmM'. The program loop is increased to obtain the target program voltage of the cell to program the cell. The reduced program voltage increment $\Delta Vpgm/K$, the reduced start program voltage Vpgm1', and the reduced target program voltage VpgmM' cause the program loop to increase, and the program voltage of the programmed memory cell to be distributed over a smaller range than that of the target program voltage distribution. This results in an under program problem where a cell is not programmed within the program loop.

Referring to FIG. 2B, a dashed line represents the wordline voltage when the increment ΔVpgm of the wordline voltage remains unchanged. A solid line represents the wordline voltage when the increment of the wordline voltage is increased from ΔVpgm to K×ΔVpgm (where K is a real number larger than 1). To enhance the program speed in the ISPP scheme, the increment ΔVpgm of the program voltage is set to a larger value, K×ΔVpgm, as illustrated in FIG. 2B. As the increment ΔVpgm of the program voltage is increased, a program loop width for obtaining the target program voltage is reduced, enhancing the program speed while a range of the program voltage of the programmed cell is extended. The start program voltage Vpgm1 and the target program voltage VpgmM are also increased as the increment ΔVpgm of the program voltage is increased by K times. Referring to FIG. 2B, the start program voltage is increased from Vpgm1 to Vpgm1", and the target program voltage is increased from VpgmM to VpgmM". The increased start program voltage Vpgm1" and the increased target program voltage VpgmM" cause an over program problem where the program voltage of the programmed memory cell is distributed over a higher range than that of the target program voltage distribution.

As described above, to satisfy the user demands, a need exists for a system and method to be able to set the increment of the wordline voltage to a random value. Also, to prevent the under program problem and the over program problem, a need exists for a memory device capable of maintaining the start program voltage or the target program voltage.

SUMMARY OF THE INVENTION

According to an embodiment of the present invention, a wordline voltage generation circuits for generating an incremental step pulse voltage, includes a first circuit unit connected to a program voltage, a second circuit unit connected between the first circuit unit and a divided voltage and controlled by a program step code, and a third circuit unit connected between the divided voltage and a ground voltage. An increment of the program voltage may be set to a value NΔV (N: real numbers larger than 0) by setting a resistance of the third circuit unit without a change in the program step code.

According to an embodiment of the present invention, the third circuit unit includes a plurality of resistors connected in series to each other and a plurality of switches respectively connected in parallel to the resistors, and the resistance of the third circuit unit is differently set by controlling the switches. Alternatively, the third circuit unit includes a plurality of resistors connected in parallel to each other and a plurality of switches respectively connected in series to the resistors, and the resistance of the third circuit unit is differently set by controlling the switches. The switches are fuses that are connected or disconnected before the start of a program cycle, for example, during the fabrication of a nonvolatile memory device. Alternatively, the switches are MOS transistors that are turned on/off under the control of a controller before the start of a program cycle.

An increment of a wordline voltage according to a program loop of the program cycle is determined by a relationship between a resistance change rate in the second circuit unit between program steps and the resistance of the third circuit unit (see Equation 3). To change the increment of the wordline voltage, the resistance of the third circuit unit is changed. The method enables the increment of the wordline voltage to be set to a value by selection of the resistance of the third circuit unit. Accordingly, the increment of the wordline voltage can be set to a value without a change in the program step code by variously selecting the resistance of the third circuit unit through the control of the switches.

According to an embodiment of the present invention, the increment of the program voltage is determined before the start of a program cycle, and the program voltage is increased by the determined increment whenever a program loop of the program cycle is repeated.

According to an embodiment of the present invention, the wordline voltage generation circuit further includes a charge pump for providing the program voltage to a selected row in response to a clock signal, and a charge pump controller for comparing the divided voltage with a reference voltage to generate the clock signal.

According to an embodiment of the present invention, a wordline voltage generation circuit for generating an incremental step pulse voltage, includes a first circuit unit connected to a program voltage, a second circuit unit connected between the first circuit unit and a divided voltage and controlled by a program step code, and a third circuit unit connected between the divided voltage and a ground voltage. The first circuit unit is symmetrical in structure to the third circuit unit, and an increment of the program voltage is set to a value NΔV (where N is a real number larger than 0) by controlling a direct proportional relationship to be maintained between a resistance of the first circuit unit and a resistance of the third circuit unit, while maintaining a start program voltage at a fixed value without a change in the program step code.

According to an embodiment of the present invention, each of the first circuit unit and the third circuit unit includes a plurality of resistors connected in series to each other and a plurality of switches respectively connected in parallel to the resistors, and each resistance of the first circuit unit and the third circuit unit is differently set by controlling the switches. Alternatively, each of the first circuit unit and the third circuit unit includes a plurality of resistors connected in parallel to each other and a plurality of switches respectively connected in series to the resistors, and each resistance of the first circuit unit and the third circuit unit is differently set by controlling the switches. The switches are fuses that are connected or disconnected before the start of a program cycle, for example, during the fabrication of a nonvolatile memory device. Alternatively, the switches are MOS transistors that are turned on/off under the control of a controller before the start of a program cycle.

The start program voltage is determined by a ratio of the resistance of the third circuit unit to the resistance of the first circuit unit (see Equation 2). The resistance of the third circuit unit is determined by the determination of the increment of the wordline voltage, and the start program voltage can be adjusted by the selection of the resistance of the first circuit unit.

According to an embodiment of the present invention, the resistance of the each resistor in the first circuit unit is in direct proportion to the resistance of the corresponding resistor in the third circuit, and the each switch in the first circuit unit and the corresponding switch in the third circuit unit are constituted by a set of switches that operate simultaneously. The ratio of the resistance of the third circuit unit to the resistance of the first circuit unit is maintained regardless of which switch set is turned on/off. The increment of the program voltage can be differently set by control of the switch sets while maintaining the start program voltage at a fixed value without a change in the program step code. Whenever the program loop of the program cycle is repeated, the wordline voltage is increased by the increment of the wordline voltage that was determined before the program cycle.

According to an embodiment of the present invention, the wordline voltage generation circuit further includes a charge pump for providing the program voltage to a selected row in response to a clock signal, and a charge pump controller for comparing the divided voltage with a reference voltage to generate the clock signal.

According to an embodiment of the present invention, a wordline voltage generation circuit for generating an incremental step pulse voltage, includes a first circuit unit connected to a program voltage, a second circuit unit connected between the first circuit unit and a divided voltage and controlled by a program step code, and a third circuit unit connected between the divided voltage and a ground voltage. The first circuit unit is symmetrical in structure to the third circuit unit, and an increment of the program voltage is set to a value $N\Delta V$ (wherein N is a real number larger than 0) by controlling an indirect proportional relationship of a function of a variable m of the m-th program loop to be maintained between a resistance of the first circuit unit and a resistance of the third circuit unit, while maintaining a target program voltage at a fixed value without a change in the program step code.

According to an embodiment of the present invention, each of the first circuit unit and the third circuit unit includes a plurality of resistors connected in series to each other and a plurality of switches respectively connected in parallel to the resistors, and each resistance of the first circuit unit and the third circuit unit is set by controlling the switches. Alternatively, each of the first circuit unit and the third circuit unit includes a plurality of resistors connected in parallel to each other and a plurality of switches respectively connected in series to the resistors, and each resistance of the first circuit unit and the third circuit unit is set by controlling the switches. The switches are fuses that are connected or disconnected before the start of a program cycle, for example, during the fabrication of a nonvolatile memory device. Alternatively, the switches are MOS transistors that are turned on/off under the control of a controller before the start of a program cycle.

The increment of the wordline voltage is determined by the resistance of the third circuit unit, and the start program voltage is adjusted by adjustment of the resistance of the first circuit unit.

According to an embodiment of the present invention, the resistance of the each resistor in the first circuit unit and the resistance of the corresponding resistor in the third circuit have therebetween an indirect proportional relationship of a function of a variable m of the m-th program loop, and the each switch in the first circuit unit and the corresponding switch in the third circuit unit operate simultaneously. Accordingly, the resistances of the first and third circuit units have a specific function relationship regardless of which switch set is turned on/off. The increment of the program voltage can be set by control of the switch sets while maintaining the target program voltage at a fixed value without a change in the program step code.

According to an embodiment of the present invention, a nonvolatile memory device using an incremental step pulse programming scheme, includes a wordline voltage generation circuit for generating a wordline voltage in response to program step codes, and a program controller for sequentially activating the program step codes during a program cycle. The wordline voltage generation circuit includes a first circuit unit connected to a program voltage, a second circuit unit connected between the first circuit unit and a divided voltage and controlled by the program step code, and a third circuit unit connected between the divided voltage and a ground voltage. An increment of the program voltage is set to a value $N\Delta V$ (wherein N is a real number larger than 0) by setting a resistance of the third circuit unit without a change in the program step code. The increment of the wordline voltage is determined in the same manner as described above.

According to an embodiment of the present invention, the third circuit unit includes a plurality of resistors connected in series to each other and a plurality of switches respectively connected in parallel to the resistors, and the resistance of the third circuit unit is set by controlling the switches. Alternatively, the third circuit unit includes a plurality of resistors connected in parallel to each other and a plurality of switches respectively connected in series to the resistors, and the resistance of the third circuit unit is set by controlling the switches. The switches are fuses that are connected or disconnected before the start of a program cycle. Alternatively, the switches are MOS transistors that are turned on/off under the control of a controller before the start of a program cycle.

According to an embodiment of the present invention, the increment of the program voltage is determined before the start of a program cycle, and the program voltage is increased by the determined increment whenever a program loop of the program cycle is repeated.

According to an embodiment of the present invention, a nonvolatile memory device using an incremental step pulse programming scheme, includes a wordline voltage generation circuit for generating a wordline voltage in response to program step codes, and a program controller for sequentially activating the program step codes during a program cycle. The wordline voltage generation circuit includes a first circuit unit connected to a program voltage, a second circuit unit connected between the first circuit unit and a divided voltage and controlled by the program step code, and a third circuit unit connected between the divided voltage and a ground voltage. The first circuit unit is symmetrical in structure to the third circuit unit, and an increment of the program voltage is set to a value $N\Delta V$ (wherein N is a real number larger than 0) by controlling a direct proportional relationship to be maintained between a resistance of the first circuit unit and a resistance of the third circuit unit, while maintaining a start program voltage at a fixed value without a change in the program step code.

According to an embodiment of the present invention, each of the first circuit unit and the third circuit unit includes a plurality of resistors connected in series to each other and a plurality of switches respectively connected in parallel to the resistors, and each resistance of the first circuit unit and the third circuit unit is set by controlling the switches. Alternatively, each of the first circuit unit and the third circuit unit includes a plurality of resistors connected in parallel to each other and a plurality of switches respectively connected in series to the resistors, and each resistance of the first circuit unit and the third circuit unit is differently set by controlling the switches. The switches are fuses that are connected or disconnected before the start of a program cycle. Alternatively, the switches are MOS transistors that are turned on/off under the control of a controller before the start of a program cycle.

According to an embodiment of the present invention, the resistance of the each resistor in the first circuit unit is in direct proportion to the resistance of the corresponding resistor in the third circuit, and the each switch in the first circuit unit and the corresponding switch in the third circuit unit are simultaneously operated, the each switch and the corresponding switch constituting a switch set. Accordingly, the ratio of the resistance of the third circuit unit to the resistance of the first circuit unit is maintained regardless of which switch set is turned on/off. The increment of the program voltage can be set by control of the switch sets while maintaining the start program voltage at a fixed value without a change in the program step code.

According to an embodiment of the present invention, a nonvolatile memory device using an incremental step pulse programming scheme, includes a wordline voltage generation circuit for generating a wordline voltage in response to program step codes, and a program controller for sequentially activating the program step codes during a program cycle. The wordline voltage generation circuit includes a first circuit unit connected to a program voltage, a second circuit unit connected between the first circuit unit and a divided voltage and controlled by the program step code, and a third circuit unit connected between the divided voltage and a ground voltage. The first circuit unit is symmetrical in structure to the third circuit unit, and an increment of the program voltage is set to a value N$\Delta$V (wherein N is a real number larger than 0) by controlling an indirect proportional relationship of a function of a variable m of the m-th program loop to be maintained between a resistance of the first circuit unit and a resistance of the third circuit unit, while maintaining a target program voltage at a fixed value without a change in the program step code.

According to an embodiment of the present invention, each of the first circuit unit and the third circuit unit includes a plurality of resistors connected in series to each other and a plurality of switches respectively connected in parallel to the resistors, and each resistance of the first circuit unit and the third circuit unit is differently set by controlling the switches. Alternatively, each of the first circuit unit and the third circuit unit includes a plurality of resistors connected in parallel to each other and a plurality of switches respectively connected in series to the resistors, and each resistance of the first circuit unit and the third circuit unit is differently set by controlling the switches. The switches are fuses that are connected or disconnected before the start of a program cycle, for example, during the fabrication of a nonvolatile memory device. Alternatively, the switches are MOS transistors that are turned on/off under the control of a controller before the start of a program cycle.

According to an embodiment of the present invention, the resistance of the each resistor in the first circuit unit and the resistance of the corresponding resistor in the third circuit have therebetween an indirect proportional relationship of a function of a variable m of the m-th program loop, and the each switch in the first circuit unit and the corresponding switch in the third circuit unit operate simultaneously. The increment of the program voltage can be set by the operation of the switch set while maintaining the target program voltage at the fixed value.

According to an embodiment of the present invention, a nonvolatile memory device using an incremental step pulse programming scheme, includes memory cells arranged in a row-and-column format, a charge pump for providing a program voltage to a selected row in response to a clock signal, a voltage divider for dividing the program voltage in response to a program step code, and a charge pump controller for comparing the divided voltage with a reference voltage to generate the clock signal. The voltage divider includes a first circuit unit connected to the program voltage, a second circuit unit connected between the first circuit unit and a divided voltage and controlled by the program step code, and a third circuit unit connected between the divided voltage and a ground voltage. The third circuit unit is symmetrical in structure to the first circuit unit, and an increment of the program voltage is set to a value N$\Delta$V (wherein N is a real number larger than 0) by controlling a direct proportional relationship to be maintained between a resistance of the first circuit unit and a resistance of the third circuit unit, while maintaining a start program voltage at a fixed value without a change in the program step code.

According to an embodiment of the present invention, the resistance of the each resistor in the first circuit unit is in direct proportion to the resistance of the corresponding resistor in the third circuit, and the each switch in the first circuit unit and the corresponding switch in the third circuit unit operate simultaneously. The switches are fuses that are connected or disconnected before the start of a program cycle. Alternatively, the switches are MOS transistors that are turned on/off under the control of a controller before the start of a program cycle.

According to an embodiment of the present invention, the memory cells each includes one of a single-level memory cell for storing one-bit data and a multi-level memory cell for storing n-bit data (wherein n is an integer equal to or larger than 2).

According to an embodiment of the present invention, a nonvolatile memory device using an incremental step pulse programming scheme, includes memory cells arranged in a row-and-column format, a charge pump for providing a program voltage to a selected row in response to a clock signal, a voltage divider for dividing the program voltage in response to a program step code, and a charge pump controller for comparing the divided voltage with a reference voltage to generate the clock signal. The voltage divider includes a first circuit unit connected to the program voltage, a second circuit unit connected between the first circuit unit and a divided voltage and controlled by the program step code, and a third circuit unit connected between the divided voltage and a ground voltage. The third circuit unit is symmetrical in structure to the first circuit unit, and an increment of the program voltage is set to a value N$\Delta$V (wherein N is a real number larger than 0) by controlling an indirect proportional function relationship to be maintained between a resistance of the first circuit unit and a resistance of the third circuit unit, while maintaining a target program voltage at a fixed value without a change in the program step code.

According to an embodiment of the present invention, the resistance of the each resistor in the first circuit unit is in direct proportion to the resistance of the corresponding resistor in the third circuit, and the each switch in the first circuit unit and the corresponding switch in the third circuit unit operate simultaneously. The switches are fuses that are connected or disconnected before the start of a program cycle, for example, during the fabrication of a nonvolatile memory device. Alternatively, the switches are MOS transistors that are turned on/off under the control of a controller before the start of a program cycle.

According to an embodiment of the present invention, the memory cells each include one of a single-level memory cell for storing one-bit data and a multi-level memory cell for storing n-bit data (wherein n is an integer equal to or larger than 2).

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the invention. In the drawings.

DETAILED DESCRIPTION OF PREFERRED EMBODIMENTS

Figure 1:
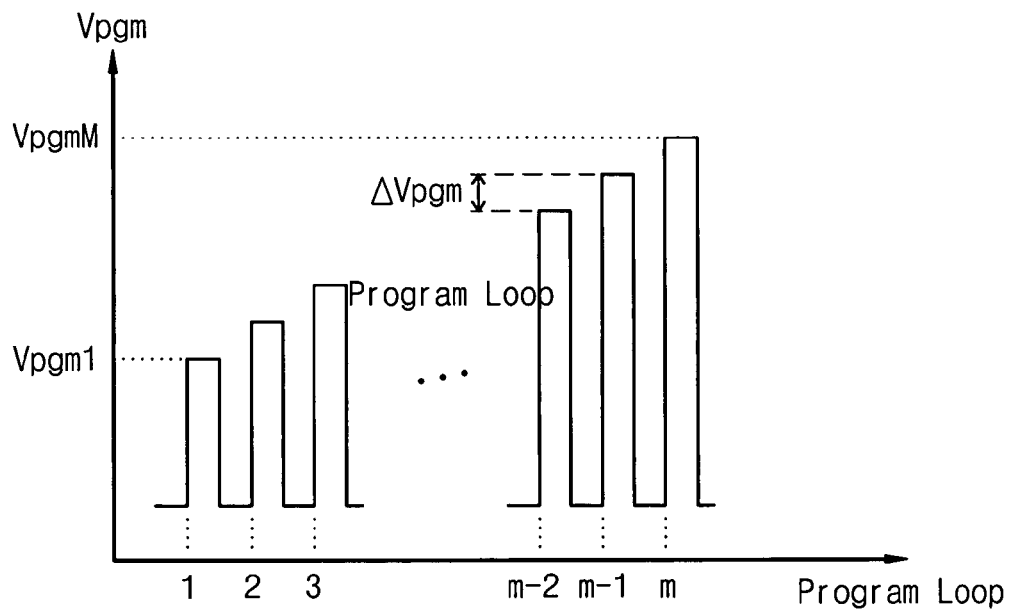
FIG. 1 is a graph illustrating a change in a wordline voltage when an ISPP scheme is used.
Figure 2A:
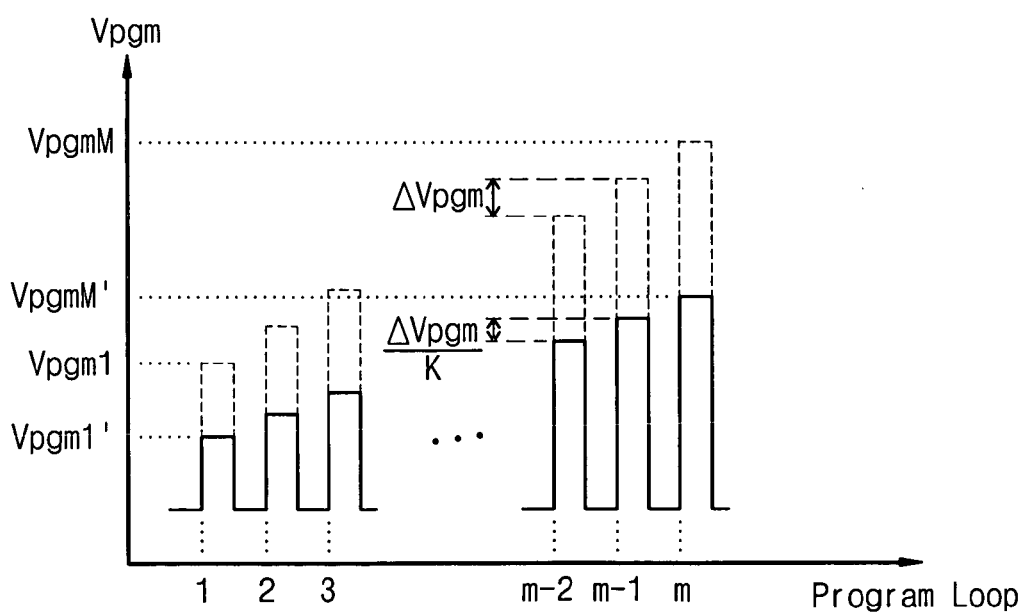
FIG. 2A is a graph illustrating a change in the wordline voltage when an increment thereof is set to a small value.
Figure 2B:
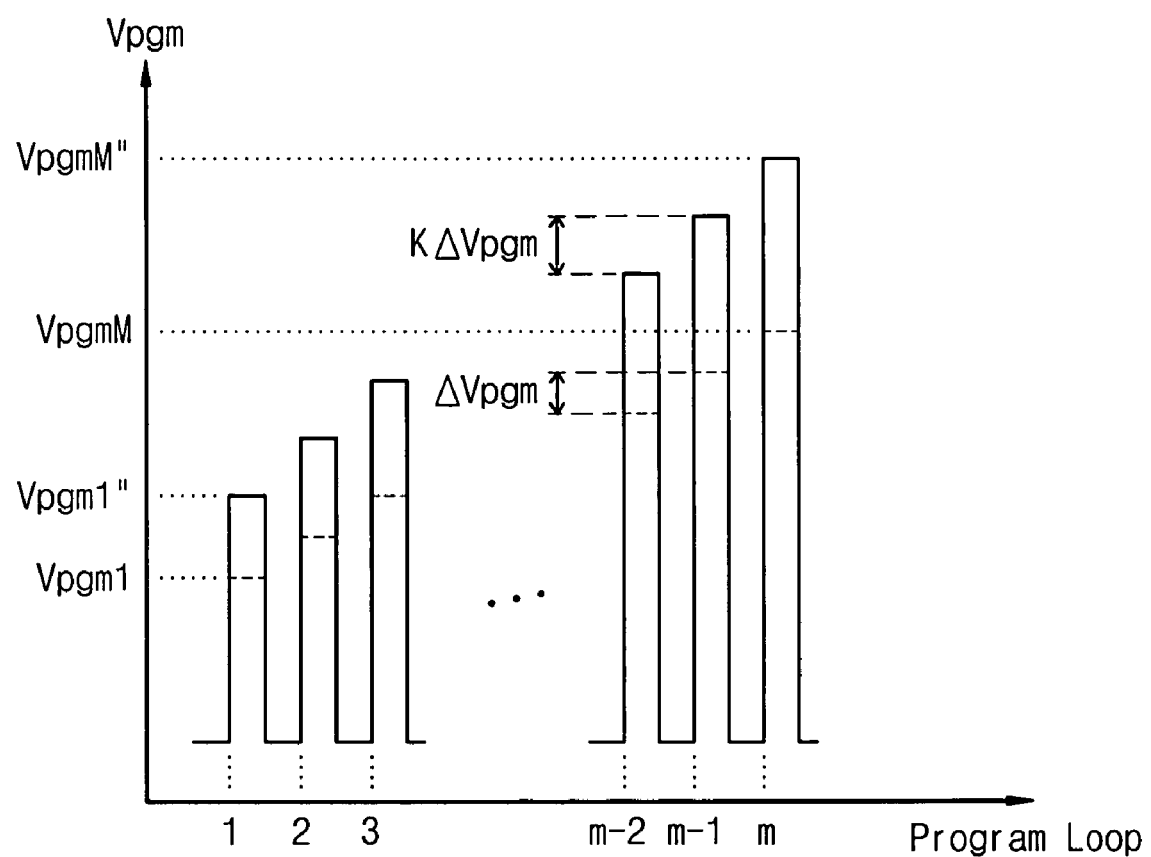
FIG. 2B is a graph illustrating a change in the wordline voltage when an increment thereof is set to a large value.

Reference will now be made in detail to preferred embodiments of the present invention, examples of which are illustrated in the accompanying drawings. However, the present invention is not limited to embodiments illustrated herein after, and embodiments herein are rather introduced to provide easy and complete understanding of the scope and spirit of the present invention. Like reference numerals in the drawings denote like elements, and thus their detailed description will be omitted for conciseness.

Figure 3:
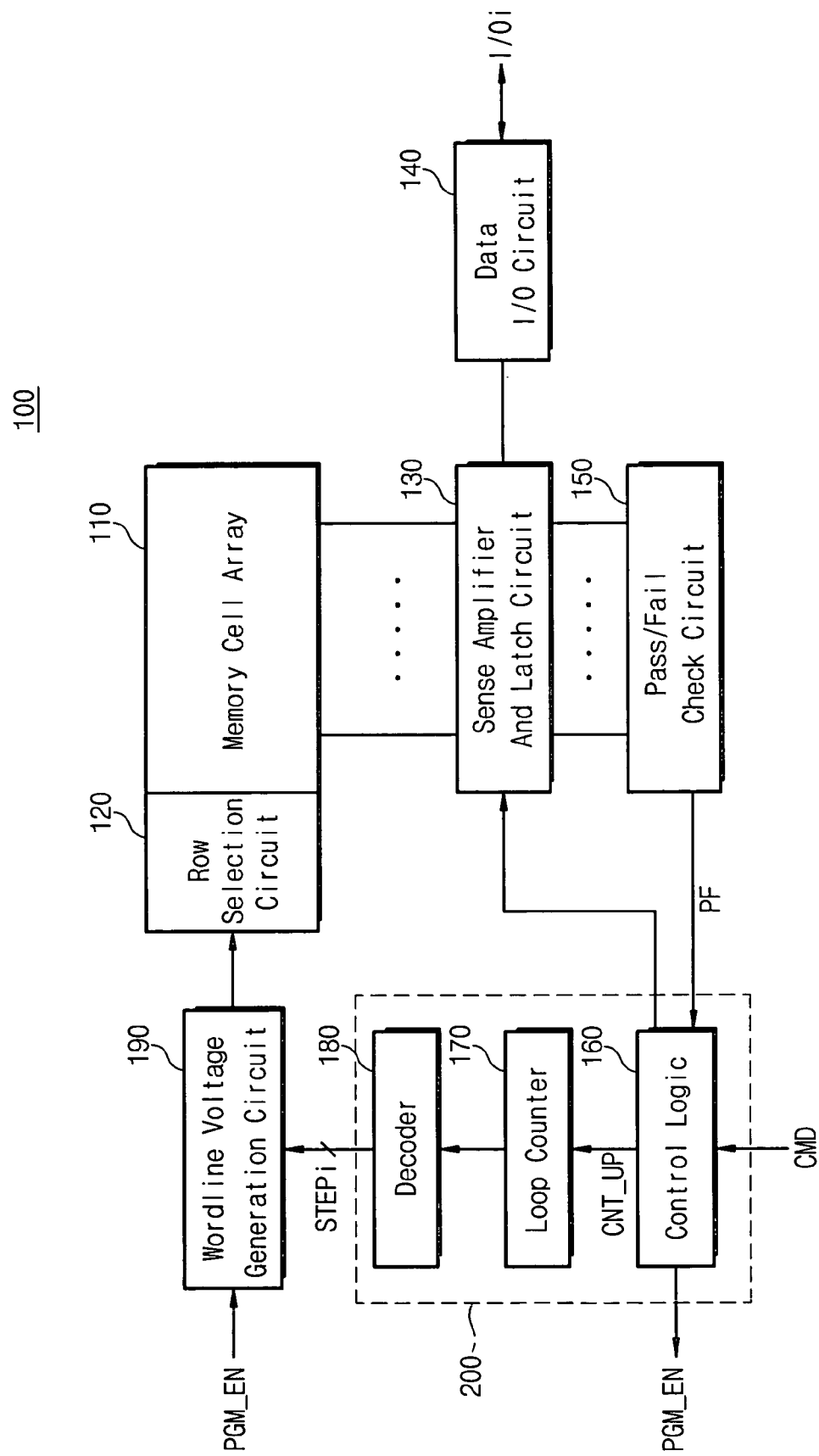
FIG. 3 is a schematic block diagram of a nonvolatile memory device according to an embodiment of the present invention.

FIG. 3 is a schematic block diagram of a nonvolatile memory device according to an embodiment of the present invention.

Referring to FIG. 3, the nonvolatile memory device 100 is a flash memory device. The nonvolatile memory device 100 includes a memory cell array 110 having memory cells arranged in a matrix form of rows and columns (e.g., wordlines and bitlines, respectively). The memory cells each store one-bit data, or n-bit data (where n is an integer greater than or equal 2). A row selection circuit 120 selects a row in response to a row address, and drives a selected row by a wordline voltage from a wordline voltage generation circuit 190. A sense amplifier and latch circuit 130 is controlled by a control logic 160, and reads data from the cell array circuit 110 in a read/verify operation. The data read in the read operation are outputted from the memory device 100 through a data input/output circuit 140. The data read in the verity operation are outputted to a pass/fail check circuit 150. The sense amplifier and latch circuit 130 receives data to be written into the memory cell array 110 from the data input/output circuit 140 in a program operation, and drives the bitlines by a program voltage (e.g., a ground voltage) or a program inhibit voltage (e.g., a power source voltage) according to the received data.

The pass/fail check circuit 150 determines in a program/erase verify operation whether or not data outputted from the sense amplifier and latch circuit 130 are the same data, and outputs a pass/fail signal PF to the control logic 160 according to determined results.

In response to the pass/fail signal PF from the pass/fail check circuit 150, the control logic 160 enables the wordline voltage generation circuit 190. For example, when the pass/fail signal PF indicates that data from the sense amplifier and latch circuit 130 does not have a pass data value, the control logic 160 activates a signal PGM_EN for enabling the wordline voltage generation circuit 190. The control logic 160 controls the sense amplifier and latch circuit 130 during each program loop of a program cycle. In response to the pass/fail signal PF from the pass/fail check circuit 150, the control logic 160 activates a count-up signal CNT_UP. For example, when the pass/fail signal PF indicates that data from the sense amplifier and latch circuit 130 does not have a pass data value, the control logic 160 activates the count-up signal CNT_UP. When the program operation of a current program loop is performed when the pass/fail signal PF indicates a pass data value, the control logic 160 deactivates the count-up signal CNT_UP to terminate the program cycle.

A loop counter counts iterations of the program loop in response to the activation of the count-up signal CNT_UP. A decoder 180 decodes an output of the loop counter 170 to generate program step codes STEPi (i=0–m). For example, as the output value of the loop counter 170 increases, the program step codes STEPi are sequentially changed. The program loop of the program cycle increases according to the sequentially-changed program step codes STEPi. Accordingly, the wordline voltage increases gradually.

The control logic 160, the loop counter 170, the decoder 180, and the wordline voltage generation circuit 190 constitute a controller 200. The controller 200 generates the signal PGM_EN for enabling the wordline voltage generation circuit 190, and generates the program steps codes STEPi for increasing the wordline voltage. When a switch set of a voltage divider 220 (see FIG. 4) in the wordline voltage generation circuit 190 is implemented by a MOS transistor, the control logic serves to turn on/off the MOS transistor before enabling the wordline voltage generation circuit 190. The switch set is described herein.

The wordline voltage generation circuit 190 is enabled by the signal PGM_EN from the control logic 160, and generates a wordline voltage Vpgm in response to the program step codes STEPi. As the program step codes STEPi is sequentially changed in the program operation, the wordline voltage generation circuit 190 increases the wordline voltage Vpgm. An increment ΔVpgm of the wordline voltage can be set to a random value according to user needs. For example, when a reduced program voltage distribution (e.g., the difference between a height of the start program voltage and a target program voltage) of the memory cell needs to be obtained, an operator sets the increment ΔVpgm of the wordline voltage to a reduced value. When the memory cell needs to be more rapidly programmed, an operator sets the increment ΔVpgm to an increased value. According to an embodiment of the present invention, the start program voltage Vpgm1 is unchanged when the increment ΔVpgm of the wordline voltage is set to different values.

Figure 4:
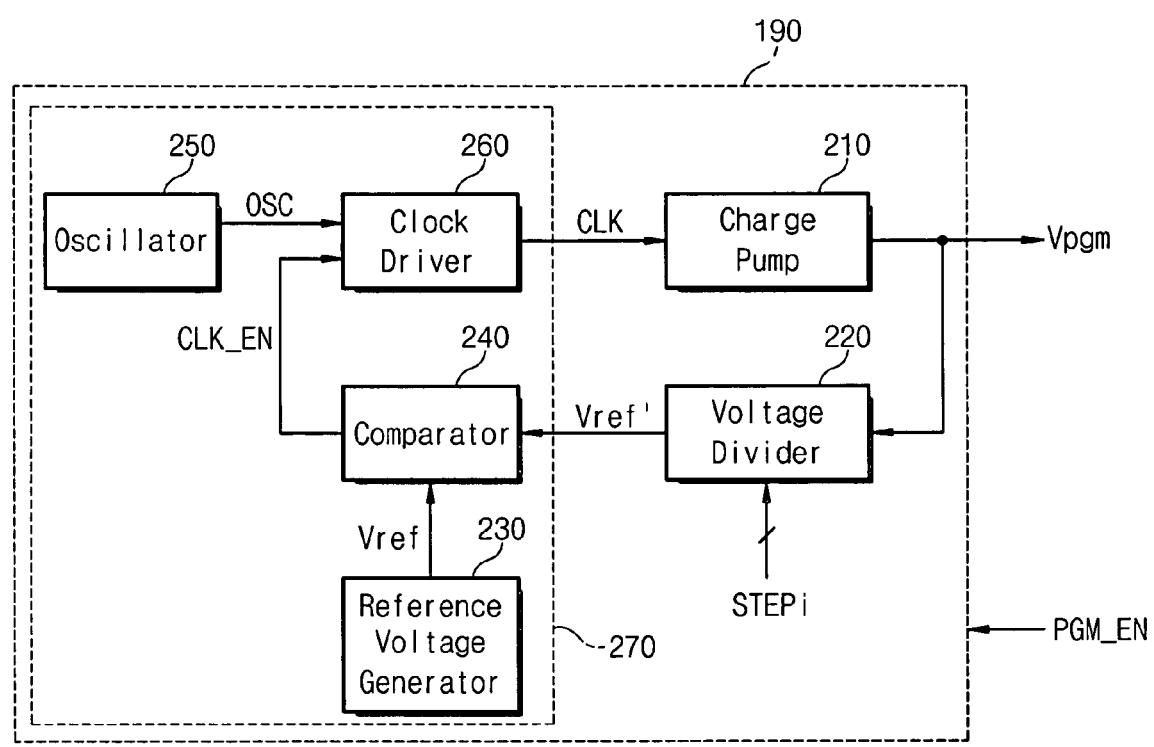
FIG. 4 is a schematic block diagram of a wordline voltage generation circuit in FIG. 3.

FIG. 4 is a schematic block diagram of the wordline voltage generation circuit 190 in FIG. 3.

Referring to FIG. 4, the wordline voltage generation circuit 190 includes a charge pump 210, a voltage divider 220, a reference voltage generator 230, a comparator 240, an oscillator 250, and a clock driver 260. The wordline voltage generation circuit 190 is enabled by the signal PGM_EN. The reference voltage generator 230, the comparator 240, the oscillator 250, and the clock driver 260 serve as a charge pump controller 270 that receives a divided voltage Vref' from the voltage divider 220 to operate the charge pump 210.

The charge pump 210 generates the wordline voltage Vpgm in response to a clock signal CLK. In response to the program step codes STEPi, the voltage divider 220 divides the wordline voltage Vpgm to generate and output the divided voltage Vref'. The divided voltage, referred to as Vref', has about the same value as the reference voltage of the reference voltage generator 230 during the program cycle.

The wordline voltage Vpgm of the voltage divider 220 is increased by the increment ΔVpgm according to the sequential change of the program step codes STEPi. The increment ΔVpgm of the wordline voltage is set to different values according to user needs. When the increment ΔVpgm is set to a different value, the start program voltage Vpgm1 is maintained at a fixed value. When the increment ΔVpgm is changed, the target program voltage VpgmM is maintained a fixed value.

The comparator 240 compares the divided voltage Vref' from the voltage divider 220 with the reference voltage Vref from the reference voltage generator 230, and generates the clock enable signal CLK_EN according to a comparison result. For example, when the divided voltage Vref' is different from the reference voltage Vref, the comparator 240 activates the clock enable signal CLK_EN. When the divided voltage Vref' is substantially identical to the reference voltage Vref, the comparator 240 deactivates the clock enable signal CLK_EN. The clock driver 260 outputs an oscillation signal OCS from the oscillator 250 as a clock signal CLK in response to the clock enable signal CLK_EN. The clock driver 260 includes an NAND gate and an inverter (not illustrated). For example, when the clock enable signal CLK_EN is activated to a high level, the oscillation signal OCS is outputted as the clock signal CLK. When the clock enable signal CLK_EN is deactivated to a low level, the oscillation signal OCS is blocked such that the clock signal CLK is not output. When the divided voltage Vref' is different in level from the reference voltage Vref due to the change of the program step code, the clock signal CLK is generated to start the operation of the charge pump 210. When the wordline voltage Vpgm reaches a desired level and thus the clock signal CLK is not generated, the charge pump 210 does not operate and the wordline voltage is maintained at a constant level. By such controls, the wordline voltage Vpgm of a desired level can be generated.

Figure 5:
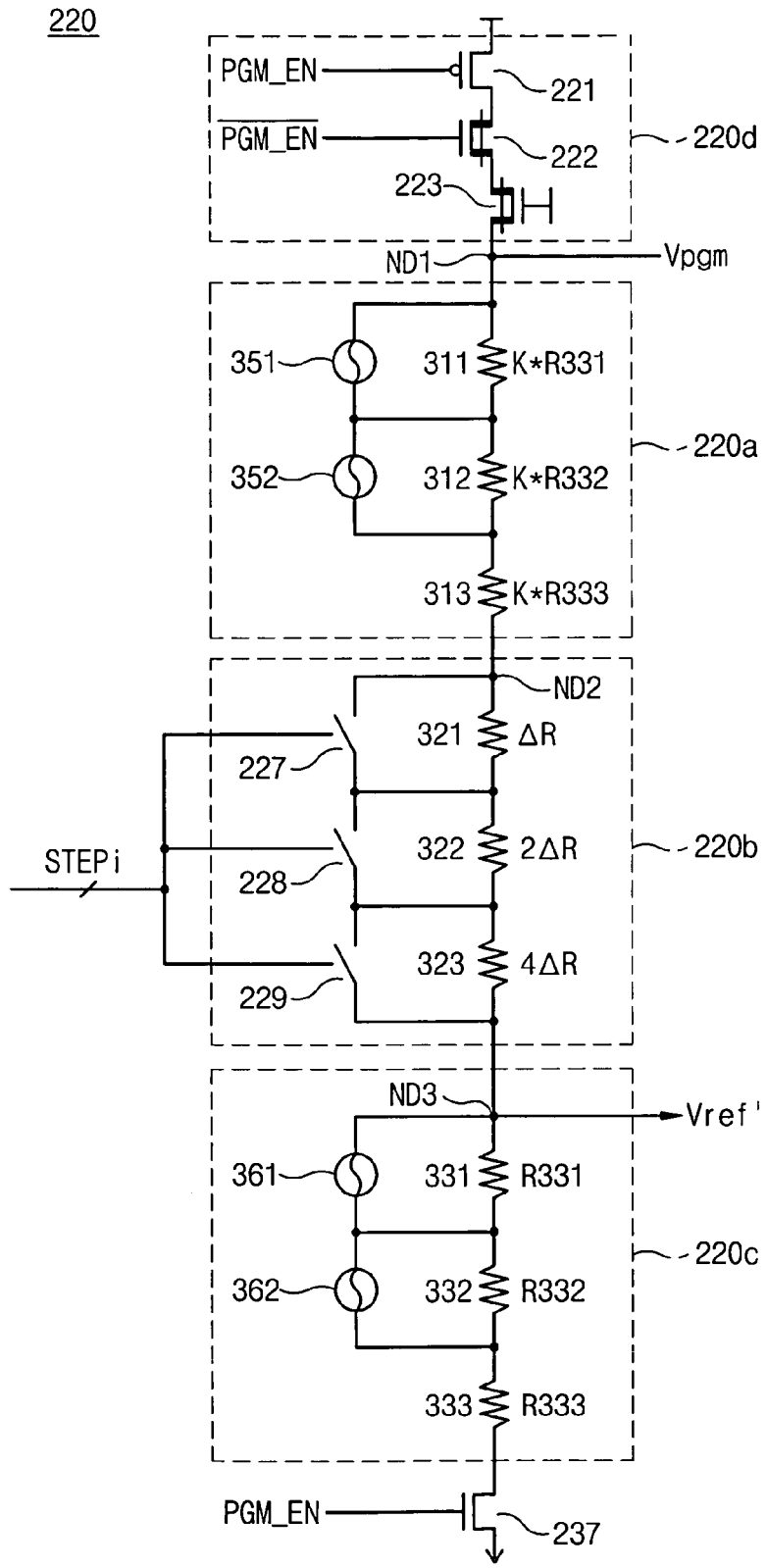
FIG. 5 is a circuit diagram of a voltage divider in FIG. 4 according to an embodiment of the present invention.
Figure 6:
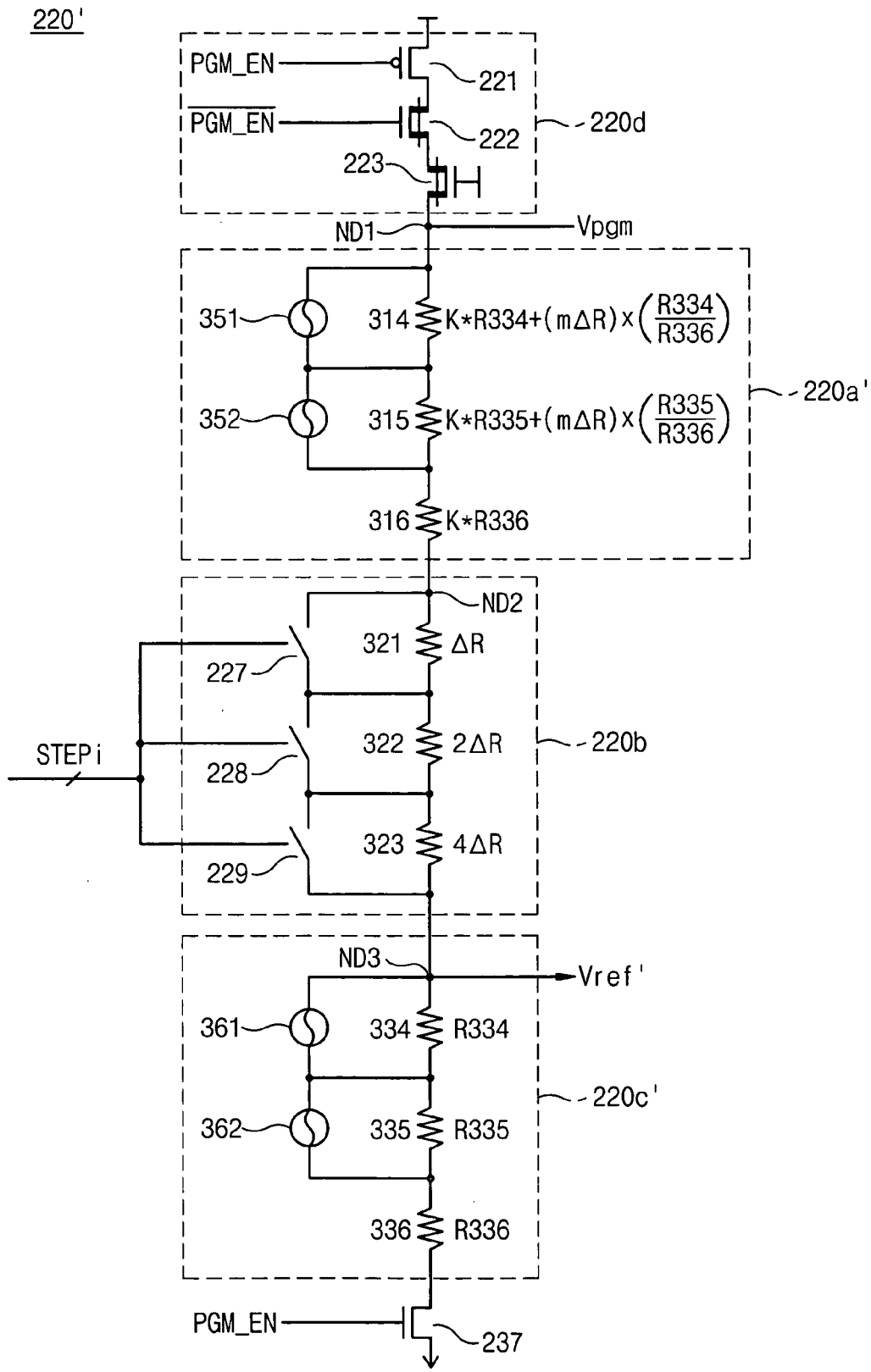
FIG. 6 is a circuit diagram of a voltage divider in FIG. 4 according to another embodiment of the present invention.
Figure 7:
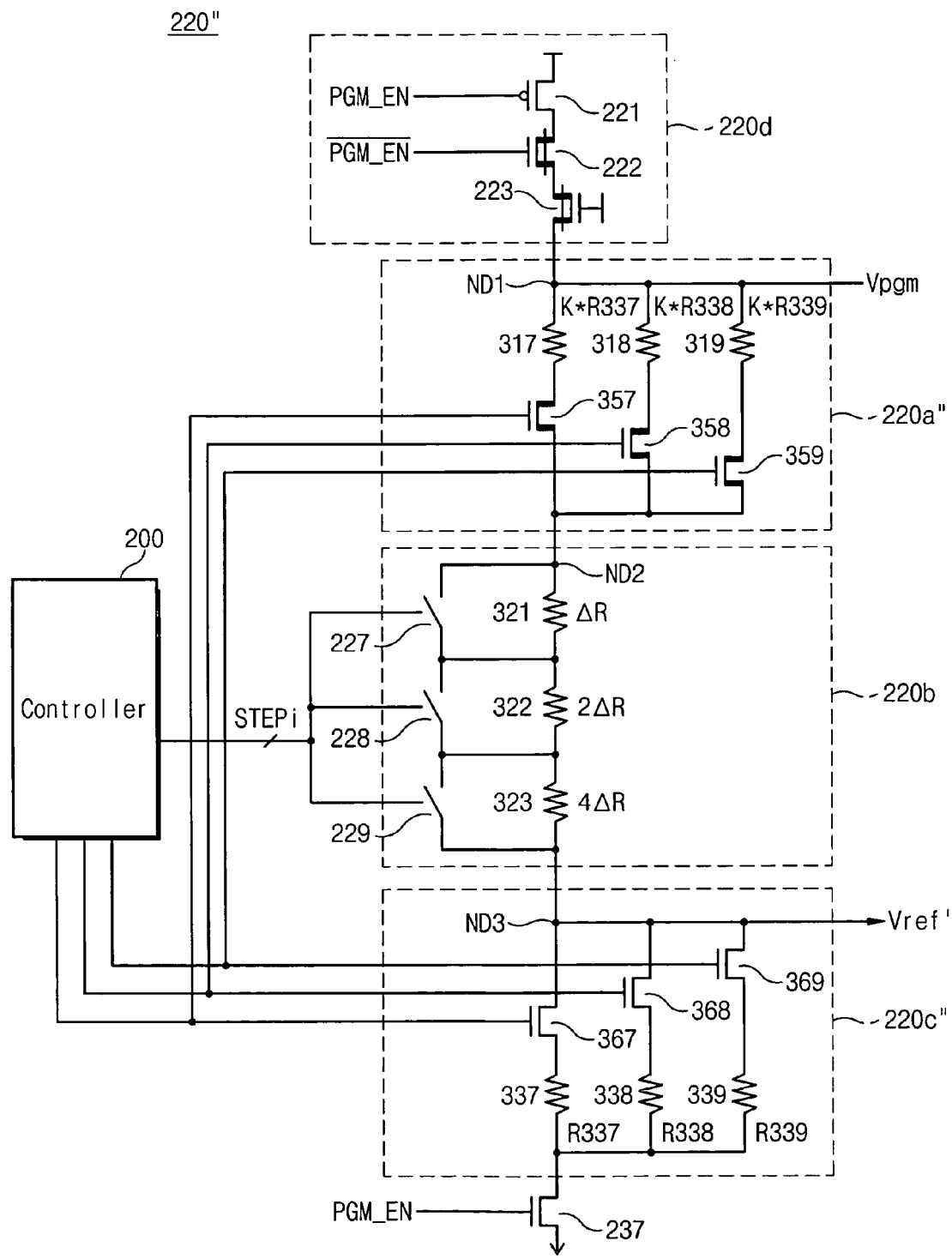
FIG. 7 is a circuit diagram of a voltage divider in FIG. 4 according to still another embodiment of the present invention.

FIGS. 5 through 7 are circuit diagrams of the voltage divider 220 according to embodiments of the present invention. The increment ΔVpgm of the wordline voltage can be set to different values without a change in the program step code. While the increment ΔVpgm of the wordline voltage is set to a different value, the start program voltage Vpgm1 and the target program voltage VpgmM re maintained at fixed values.

FIG. 5 is a circuit diagram of the voltage divider 220 according to an embodiment of the present invention. In FIG. 5, in case where the increment ΔVpgm of the wordline voltage is set to a different value, the start program voltage Vpgm1 is maintained.

Referring to FIG. 5, the voltage divider 220 includes a first circuit unit 220a, a second circuit unit 220b, a third circuit unit 220c, and a discharge unit 220d. The discharge unit 220d is connected to a node ND1 receiving the wordline voltage Vpgm, and discharges a high voltage, which is the wordline voltage, of the node ND1 as a power source voltage in response to the enable signal PGM_EN. The discharge unit 220d includes a PMOS transistor 221 and depletion-type NMOS transistors 222 and 223. The depletion-type NMOS transistor is a well-known high-voltage transistor capable of enduring a high voltage.

The first circuit unit 220a is connected between the node ND1 and a node ND2. The node ND1 receives the program voltage, and the node ND2 is connected to the first circuit unit 220a and the second circuit unit 220b. The first circuit unit 220a includes three serially-connected resistors 311, 312 and 313 and two fuses 351 and 352 connected in parallel to the resistor 311 and the resistor 312, respectively. The two fuses 351 and 352 each are connected or disconnected before the enablement of the wordline voltage generation circuit 190, for example, during the fabrication of the memory device. A resistance R1 of the first circuit unit 220a is determined according to the connection or disconnection of the fuses 351 and 352. Consequently, the resistance R1 of the first circuit unit 220a can be adjusted to adjust the start program voltage Vpgm1.

The second circuit unit 220b includes three resistors 321, 322 and 323 having different resistances and three switches 227, 228 and 229 connected in parallel to the resistors 321, 322 and 323, respectively. For example, when the resistor 321 has a resistance of ΔR, the resistor 322 has a resistance of 2ΔR and the resistor 323 has a resistance of 4ΔR. The switches 227, 228 and 229 are controlled by the program step codes STEPi. The program step code STEPi is a three-bit control code. For example, the program step code of the first program loop is "000", and the next program code of the next program loop is "001". When the program step code is "000", the switches 227, 228 and 229 are all turned on to form a current path between the resistors 321, 322 and 323. In this case, the lowest wordline voltage, the start program voltage Vpgm1, is outputted. When the program step code is "001", the switch 227 is turned off and the switches 228 and 229 are turned on. In this case, the lowest wordline voltage is increased by the increment ΔVpgm in comparison with a previous voltage level. When the program step code is "111", the switches 227, 228 and 229 are turned off and a current flows through the resistors 321, 322 and 323. In this case, the highest wordline voltage is outputted. Accordingly, as the program step code increases, the wordline voltage is increased. Although an active low signal is used, it should be apparent to those skilled in the art that other signals can be similarly used.

The resistance R1 of the first circuit unit 220a is predetermined before the enablement of the wordline voltage generation circuit 190, and the resistance R2 of the second circuit unit 220b is changed in response to the program step code STEPi during the program cycle. The sum of the resistance R1 and the resistance R2 is referred to as R12.

The third circuit unit 220c is connected between the ground voltage and a node ND3 for outputting the divided voltage Vref'. The third circuit unit 220c includes three serially-connected resistors 331, 332 and 333 and two fuses 361 and 362 connected in parallel to the resistor 331 and the resistor 332, respectively. An MOS transistor 237 is connected between the third circuit unit 220c and the ground voltage. The MOS transistor 237 is turned on during the activation of the program enable signal PGM_EN. The MOS transistor 237 is turned off during the deactivation of the signal PGM_EN, thereby substantially preventing a leakage current. Like the two fuses 351 and 352, the two fuses 361 and 362 are each connected or disconnected by an operator before the enablement of the wordline voltage generation circuit 190, for example, during the fabrication of the memory device. Accordingly, a resistance R3 of the third circuit unit 220c is determined according to the connection or disconnection of the fuses 361 and 362. The increment ΔVpgm of the wordline voltage is determined according to the resistance R3 of the third circuit unit 220c. The resistance R3 of the third circuit unit 220c is determined before the enablement of the wordline voltage generation circuit 190.

The first circuit unit 220a and the third circuit unit 220c are symmetrical to each other with the second circuit unit 220b connected therebetween. The first and third units 220a and 220c form a mirror structure. The first and third circuit units 220a and 220c have the same number of resistors. The fuses in the first and third circuits units 220a and 220c serve as switches.

The fuses 351 and 361 (also the fuses 352 and 362) operate as one switch set because they are simultaneously connected or disconnected. The fuses 351 and 361 will be referred to as a switch set A, and the fuses 352 and 362 will be referred to as a switch set B.

Each pair of the resistors 311 and 331, the resistors 312 and 332, and the resistors 313 and 333 form a respective resistor set. Each resistor set is connected to or disconnected from the corresponding switch set to operate simultaneously. The resistors 311 and 331 will be referred to as a resistor set A, the resistors 312 and 332 will be referred to as a resistor set B, and the resistors 313 and 333 will be referred to as a resistor set C.

The program voltage Vpgm, the increment ΔVpgm and the divided voltage Vref' in the voltage divider 220 are determined as follows:

The divided voltage Vref' is determined by the resistance R1 of the first circuit unit 220a, the resistance R2 of the second circuit unit 220b and the resistance R3 of the third circuit unit 220c as shown in Equation 1.

$$Vref' = Vpgm\left(\frac{R3}{R12+R3}\right) \quad (1)$$

In Equation 1, R12=R1+R2. The divided voltage Vref' is compared with the reference voltage Vref by the comparator 240.

The wordline voltage Vpgm can be expressed as shown in Equation 2.

$$Vpgm = Vref'\left(1 + \frac{R12}{R3}\right) \quad (2)$$

As can be seen from Equation 2, the wordline voltage Vpgm depends on a ratio of R12/R3. The resistance R3 of the third circuit unit 220c is determined by the connection or disconnection of the switches 361 and 362 before the program operation, for example, during the fabrication of the memory device. The resistance R1 of the first circuit unit 220a is determined by the connection or disconnection of the switches 351 and 352 before the enablement of the wordline voltage generation circuit 190, for example, during the fabrication of the memory device. Accordingly, the resistance R12 is changed by the resistance R2 of the second circuit unit 220b that is changed by the program step code STEPi during the program operation, and the wordline voltage Vpgm is changed accordingly. In this case, the resistance R2 of the second circuit unit 220b becomes 0Ω during the first loop of the program cycle because the switches 227, 228 and 229 respectively connected in parallel to the resistors 321, 322 and 323 of the second circuit unit 220b are turned on by the program step code "000". Accordingly, the resistance R12 equals the resistance R1 of the first circuit unit 220a during the first loop of the program cycle.

The start program voltage Vpgm1 is determined by the resistance R1 of the first circuit unit 220a and the resistance R3 of the third circuit unit 220c. When the resistance of the resistor of each resistor set in the first circuit unit 220a and the resistance of the corresponding resistor in the third circuit unit 220c are determined to have a directly-proportional relationship therebetween, the start program voltage Vpgm1 can be maintained even when the other resistor sets are selected to change the increment ΔVpgm of the wordline voltage. When the resistances of the resistors in each resistor set are determined to have an indirectly-proportional relationship of a function of a variable "m" of the m-th program loop, the target program voltage VpgmM can be maintained even when the other resistor sets are selected to change the increment ΔVpgm of the wordline voltage. This will now be described in detail.

The increment ΔVpgm (where ΔVpgm=Vpgm2−Vpgm1) of the wordline voltage can be expressed as shown in Equation 3.

$$\Delta Vpgm = Vref'\frac{\Delta R}{R3} \quad (3)$$

In Equation 3, "ΔR" represents a change rate of the resistance R12 between consecutive program steps, and is constant during the program loop of the program cycle. Since the resistance R3 is determined before the start of the program cycle, for example, during the fabrication of the memory device, the increment ΔVpgm of the wordline voltage is constant during the program loop of the program cycle. As can be seen from Equation 3, the when the resistance R3 is increased, the increment ΔVpgm of the wordline voltage is decreased. When the resistance R3 is decreased, the increment ΔVpgm of the wordline voltage is increased.

As can be seen from Equation 3, the change rate ΔR or the resistance R3 needs to be changed to change the increment ΔVpgm so as to satisfy the various user needs. An additional circuit for changing the program step code is needed so as to change the change rate ΔR, and the increment ΔVpgm can be changed only by an integer multiple of a default value even when the program step code is changed. Accordingly, the change rate ΔR is maintained at a fixed value, and the resistance R3 of the third circuit unit 220c is changed so as to set the increment ΔVpgm of the program voltage to a given value. The third circuit unit 220c serves to determine the increment ΔVpgm of the program voltage.

As can be seen from Equation 2, the start program voltage Vpgm1 is determined by a ratio of the resistance R1 to the resistance R3. When the resistance R3 of the third circuit 220c is fixed so as to determine the increment ΔVpgm of the program voltage, the start program voltage Vpgm1 can be adjusted by the resistance R1 of the first circuit unit 220a.

Accordingly, the first circuit unit 220a serves to adjust the start program voltage Vpgm1.

In FIG. 5, the resistance of the resistor of each resistor set in the first circuit unit 220a is in direct proportion to the resistance of the corresponding resistor in the third circuit unit 220c. For example, the resistors 311, 312 and 313 in the first circuit unit 220a have K times the resistance of the resistors 331, 332 and 333 in the third circuit unit 220c. When the resistances of the resistors 311, 312, 313, 331, 332 and 333 are R311, R312, R313, R331, R332 and R333, respectively, the resistance of the each resistor can be represented as follows:

$$R311 = K \times R331$$

$$R312 = K \times R332$$

$$R313 = K \times R333$$

Table 1 below shows the increment ΔVpgm of the program voltage and the start program voltage Vpgm1 according to the connection states of the switches 351, 352, 361 and 362. The increment ΔVpgm and the start program voltage Vpgm1 may be determined by Equations 2 and 3.

TABLE 1

| Case | 351 | 361 | 352 | 362 | ΔVpgm | Vpgm1 |
|------|-----|-----|-----|-----|-------|-------|
| 1 | on | on | on | on | Vref(ΔR/R333) | Vref(1 + K) |
| 2 | on | on | off | off | Vref(ΔR/(R332 + R333)) | Vref(1 + K) |
| 3 | off | off | on | on | Vref(ΔR/(R331 + R333)) | Vref(1 + K) |
| 4 | off | off | off | off | Vref(ΔR/(R331 + R332 + R333)) | Vref(1 + K) |

As seen from Table 1, the switches 351 and 361 forming the switch set A are simultaneously connected or disconnected, and the switches 352 and 362 forming the switch set B are simultaneously connected or disconnected. As can be seen from Table 1, the increment ΔVpgm of the program voltage is decreased as the connection states of the switches change from Case 1 to Case 4. Since the increment ΔVpgm is changed according to the resistances of the resistors of the third circuit unit and the on/off of the switch connected to each of the resistors, the increment ΔVpgm of the wordline voltage can be set to different values without a change in the program step code. In each case where the increment ΔVpgm of the wordline voltage is set to a different value, the start program voltage Vpgm1 has a constant value of Vref (1+K). Accordingly, in the nonvolatile memory device using the ISPP program scheme, the increment ΔVpgm of the wordline voltage can be set to different values by the structure and operation of the switch sets without a change in the program step code, thereby maintaining the voltage of the first program loop at a constant value.

FIG. 6 is a circuit diagram of a voltage divider in FIG. 4 according to another embodiment of the present invention. In FIG. 6, in a case where the increment of the wordline voltage is set to a different value, the target program voltage VpgmM, a voltage of the m-th program loop, is maintained.

Referring to FIG. 6, the voltage divider 220' includes a first circuit unit 220a', a second circuit unit 220b, a third circuit unit 220c', and a discharge unit 220d. In FIG. 6, the operation principle, the second circuit 220b and the discharge unit 220d are substantially the same as described with respect to FIG. 5 and thus their descriptions will be omitted.

The first circuit unit 220a' is connected between a node ND1 and a node ND2. The node ND1 receives the program voltage Vpgm, and the node ND2 is connected to the first circuit unit 220a' and the second circuit unit 220b. The first circuit unit 220a' includes three serially-connected resistors 314, 315 and 316 and two fuses 351 and 352 connected in parallel to the resistor 314 and the resistor 315, respectively. The two fuses 351 and 352 each are connected or disconnected by an operator during the fabrication of the memory device. Accordingly, a resistance R1' of the first circuit unit 220a' is determined according to the connection or disconnection of the fuses 351 and 352. The resistance R1' of the first circuit unit 220a' can be adjusted to adjust the start program voltage Vpgm1.

The resistance R1' of the first circuit unit 220a' is predetermined before the enablement of the wordline voltage generation circuit 190. The resistance R2 of the second circuit unit 220b is changed in response to the program step code STEPi during the program cycle. The sum of the resistance R1' and the resistance R2 is referred to as R12.

The third circuit unit 220c' is connected between the ground voltage and a node ND3. The third circuit unit 220c' outputs the divided voltage Vref. The third circuit unit 220c' includes three serially-connected resistors 334, 335 and 336 and two fuses 361 and 362 connected in parallel to the resistor 334 and the resistor 335, respectively. Like the two fuses 351 and 352, the two fuses 361 and 362 each are connected or disconnected by an operator during the fabrication of the memory device. A resistance R3' of the third circuit unit 220c' is determined according to the connection or disconnection of the fuses 361 and 362. The increment ΔVpgm of the wordline voltage is determined according to the resistance R3' of the third circuit unit 220c'. The resistance R3' of the third circuit unit 220c is determined before the enablement of the wordline voltage generation circuit 190.

The first circuit unit 220a' and the third circuit unit 220c' are symmetrical to each other with the second circuit unit 220b connected therebetween. The first and third units 220a' and 220c' form a mirror structure. The first and third circuit units 220a' and 220c' have the same number of resistors. The fuses in the first and third circuits units 220a' and 220c' serve as switches.

The fuses 351 and 361 (also the fuses 352 and 362) operate as one switch set because they are simultaneously connected or disconnected. The fuses 351 and 361 will be referred to as a switch set A, and the fuses 352 and 362 will be referred to as a switch set B.

Each pair of the resistors 314 and 334, the resistors 315 and 335, and the resistors 316 and 336 form a respective resistor set. Each resistor set is connected to or disconnected from the corresponding switch set to operate simultaneously. The resistors 314 and 334 will be referred to as a resistor set A, the resistors 315 and 335 will be referred to as a resistor set B, and the resistors 316 and 336 will be referred to as a resistor set C.

In each of the resistor sets, the resistance of the resistor in the first circuit unit 220a' and the resistance of the corresponding resistor in the third circuit unit 220c' have therebetween an indirectly-proportional relationship of a function of a variable "m" of the m-th program loop. For example, the resistances R314, R315 and R316 of the resistors 314, 315 and 316 in the first circuit unit 220a' and the resistances R334, R335 and R336 of the resistors 334, 335 and 336 in the third circuit unit 220c' are determined as follows:

$$R314 = K \times R334 + (m\Delta R) \times (R334/R336)$$

$$R315 = K \times R335 + (m\Delta R) \times (R335/R336)$$

$$R316 = K \times R336$$

wherein m is a wordline voltage loop number.

Table 2 below shows the increment ΔVpgm of the wordline voltage and the target program voltage VpgmM according to the connection states of the switches 351, 352, 361 and 362. The increment ΔVpgm and the target program voltage VpgmM may be determined as shown in Equations 2 and 3.

TABLE 2

| Case | 351 | 361 | 352 | 362 | ΔVpgm | VpgmM |
|---|---|---|---|---|---|---|
| 1 | on | on | on | on | Vref(ΔR/R336) | Vref(1 + K + mΔR/R336) |
| 2 | on | on | off | off | Vref(ΔR/(R335 + R336)) | Vref(1 + K + mΔR/R336) |
| 3 | off | off | on | on | Vref(ΔR/(R334 + R336)) | Vref(1 + K + mΔR/R336) |
| 4 | off | off | off | off | Vref(ΔR/(R334 + R335 + R336)) | Vref(1 + K + mΔR/R336) |

As seen from Table 2, the switches 351 and 361 forming the switch set A are simultaneously connected or disconnected, and the switches 352 and 362 forming the switch set B are simultaneously connected or disconnected. As can be seen from Table 2, the increment ΔVpgm of the wordline voltage is increased as the connection states of the switches change from Case 1 to Case 4. The increment ΔVpgm is changed according to the resistances of the resistors of the third circuit unit 220c' and the on/off of the switch connected to each of the resistors, and the increment ΔVpgm of the wordline voltage can be set to different values without a change in the program step code. In each case where the increment ΔVpgm of the wordline voltage is set to a different value, the target program voltage VpgmM has a constant value of Vref(1+K+mΔR/R336). In the nonvolatile memory device using the ISPP program scheme, the increment ΔVpgm of the wordline voltage can be set to a different value by the structure and operation of the switch sets without a change in the program step code, thereby maintaining the voltage of the m-th program loop at a constant value.

FIG. 7 is a circuit diagram of the voltage divider 220" according to still another embodiment of the present invention.

Referring to FIG. 7, the voltage divider 220" includes a first circuit unit 220a", a second circuit unit 220b, a third circuit unit 220c", and a discharge unit 220d. In FIG. 7, the operation principle, the second circuit 220b and the discharge unit 220b are substantially the same as the FIG. 5 embodiment and thus their descriptions will be omitted.

The first circuit unit 220a" is connected between a node ND1 and a node ND2. The node ND1 receives the program voltage Vpgm. The node ND2 is connected to the first circuit unit 220a" and the second circuit unit 220b. The first circuit unit 220a" includes three resistors 317, 318 and 319 connected in parallel to one another and three MOS transistors 357, 358 and 359 connected in series to the resistor 317, the resistor 318 and the resistor 319, respectively. The MOS transistors 357, 358 and 359 serve as switches controlled by the controller 200, thereby substantially preventing a high voltage. The switches (MOS transistors) 357, 358 and 359 each are turned on or off through the controller 200 by an operator before the enablement of the wordline voltage generation circuit 190. On/off states of the switches 357, 358 and 359 are not changed during the program operation. A resistance R1" of the first circuit unit 220a" is determined according to the on/off states of the switches 357, 358 and 359. The start program voltage Vpgm1 can be adjusted according to the resistance R1" of the first circuit unit 220a".

The third circuit unit 220c" is connected between the ground voltage and a node ND3. The third circuit unit 220c" outputs the divided voltage Vref. The third circuit unit 220c" includes three resistors 337, 338 and 339 connected in parallel to one another and three transistors 367, 368 and 369 connected in series to the resistors 337, 338 and 339, respectively. The resistances R337, R338 and R339 of the resistors 337, 338 and 339 in the third circuit unit 220c" are in direct or indirect proportion to the resistances R317, R318 and R319 of the corresponding resistors 317, 318 and 319 in the first circuit unit 220a". This is substantially the same as the embodiments in FIGS. 5 and 6. The three transistors 367, 368 and 369 serve as switches controlled by the controller 200. The three switches (transistors) 367, 368 and 369 each are turned on or off by the controller 200 before the enablement of the wordline voltage generation circuit 190. Accordingly, a resistance R3" of the third circuit unit 220c" is determined according to the on/off states of the switches 367, 368 and 369. The increment ΔVpgm of the wordline voltage can be changed by the change of the resistance R3" of the third circuit unit 220c" without the change of the program step code.

The first circuit unit 220a" and the third circuit unit 220c" are symmetrical to each other with the second circuit unit 220b connected therebetween. The first and third units 220a" and 220c" form a mirror structure. The first and third circuit units 220a" and 220c" have the same number of resistors. The transistors in the first and third circuits units 220a' and 220c' serve as switches.

The transistors (switches) 357 and 367 (also the transistors 358 and 368 and the transistors 359 and 369) operate as a switch set. Each switch set is simultaneously turn on or off. The switches 357 and 367 will be referred to as a switch set A, the switches 358 and 368 will be referred to as a switch set B, and the switches 359 and 369 will be referred to as a switch set C.

Each pair of the resistors 317 and 337, the resistors 318 and 338, and the resistors 319 and 339 form a respective resistor set. Each resistor set is connected to the corresponding switch set to operate simultaneously. The resistors 317 and 337 will be referred to as a resistor set A, the resistors 318 and 338 will be referred to as a resistor set B, and the resistors 319 and 339 will be referred to as a resistor set C.

For example, reference will be made to a case where the resistances R337, R338 and R339 of the resistors 337, 338 and 339 in the third circuit unit 220c" are in direct proportion to the resistances R317, R318 and R319 of the corresponding resistors 317, 318 and 319 in the first circuit unit 220a". The corresponding resistors 317, 318 and 319 have K times the resistance of the resistors 337, 338 and 339. It is assumed that R337>R338>R339.

$$R317 = K \times R337$$

$$R318 = K \times R338$$

$$R319 = K \times R339$$

$$R337 > R338 > R339$$

Table 3 below shows the increment ΔVpgm of the program voltage Vpgm and the start program voltage Vpgm1 according to the connection states of the switch sets A, B and C. The increment ΔVpgm and the start program voltage Vpgm1 may be determined according to Equations 2 and 3. Since the switches of the switch set are simultaneously turned on or off, the states of the switches are represented using the switch sets.

TABLE 3

| Case | Switch Set A | Switch Set B | Switch Set C | ΔVpgm | Vpgm1 |
|------|--------------|--------------|--------------|-------|-------|
| 1 | on | off | off | Vref(ΔR/R337) | Vref(1 + K) |
| 2 | off | on | off | Vref(ΔR/R338) | Vref(1 + K) |
| 3 | off | off | on | Vref(ΔR/R339) | Vref(1 + K) |
| 4 | on | on | off | Vref(ΔR/(R337□R338)) | Vref(1 + K) |
| 5 | on | off | on | Vref(ΔR/(R337□R339)) | Vref(1 + K) |
| 6 | off | on | on | Vref(ΔR/(R338□R339)) | Vref(1 + K) |
| 7 | on | on | on | Vref(ΔR/(R337□R338□R339)) | Vref(1 + K) |

In Table 3, "□" represents the parallel resistance of the resistors.

A case where the switch sets A, B and C are all turned off is not shown in Table 3 because the voltage divider 220 does not operates in that case.

As can be seen from Table 3, the number of switches turned on increases from Case 1 to Case 7, the denominator of the increment ΔVpgm of the wordline voltage decreases, and the increment ΔVpgm increases. In each case, the start program voltage Vpgm1 has a constant value of Vref(1+K). The increment ΔVpgm can be increased by selection of the proper resistance of the third circuit unit 220c″, while the start program voltage Vpgm1 is maintained. It should be apparent to those skilled in the art that another case where the increment ΔVpgm is increased with the target program voltage VpgmM maintained can also be described in the same manner as the above case where the increment ΔVpgm is increased with the start program voltage Vpgm1 maintained.

Although three resistors are used in each circuit unit of the above embodiments, it should be apparent to those skilled in the art that the number of the resistors used can be changed.

FIGS. 8A, 8B, 9A and 9B are graphs illustrating a change in the wordline voltage according to embodiments of the present invention. In the graphs, the start program voltage and the target program voltage are denoted as Vpgm1 and VpgmM when the increment of the program voltage is ΔVpgm. The start program voltage and the target program voltage are represented using superscripts when the increment of the program voltage is different from ΔVpgm.

Figure 8A:
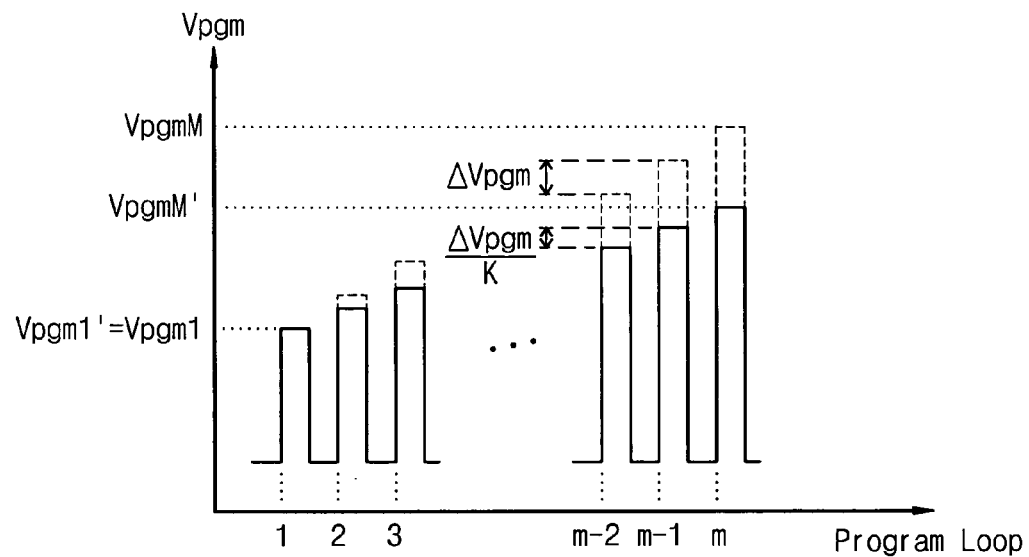
FIGS. 8A and 8B are graphs illustrating a change in a wordline voltage when an increment thereof is changed with a start program voltage remaining unchanged according to an embodiment of the present invention.
Figure 8B:
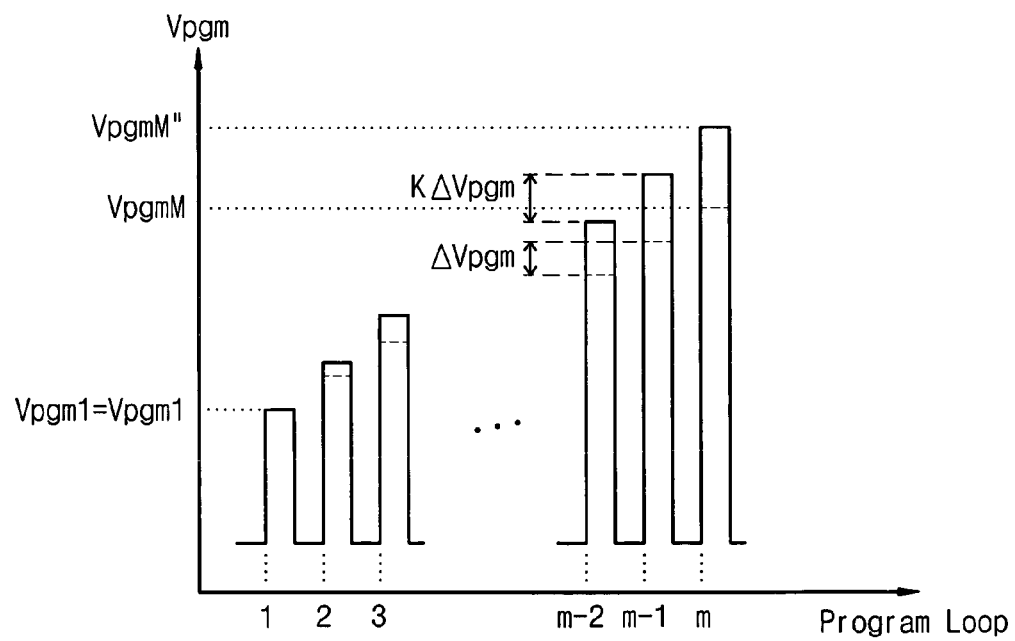

FIGS. 8A and 8B are graphs illustrating a change in a wordline voltage when an increment thereof is changed with the start program voltage remaining unchanged according to an embodiment of the present invention.

Referring to FIG. 8A, a dashed line represents a change in the wordline voltage when the increment ΔVpgm of the program voltage remains unchanged, while a solid line represents a change in the wordline voltage when the increment of the program voltage is reduced from ΔVpgm to ΔVpgm/K (where K is a real number larger than 1). Since the increment of the program voltage decreases, the distribution of the program voltage of the programmed memory cell decreases. As illustrated in FIG. 8A, the start program voltage Vpgm1' is fixed at Vpgm1 when the increment of the program voltage is ΔVpgm/K, and the under program problem can be substantially prevented.

Referring to FIG. 8B, a dashed line represents a change in the wordline voltage when the increment ΔVpgm of the program voltage remains unchanged, while a solid line represents a change in the wordline voltage when the increment ΔVpgm of the program voltage is increased from ΔVpgm to K×ΔVpgm (where K is a real number larger than 1). Since the increment of the program voltage increases, the memory cell can be rapidly programmed. As illustrated in FIG. 8B, the start program voltage Vpgm1″ is fixed at Vpgm1 when the increment of the program voltage is K×ΔVpgm, and the over program problem can be substantially prevented.

Figure 9A:
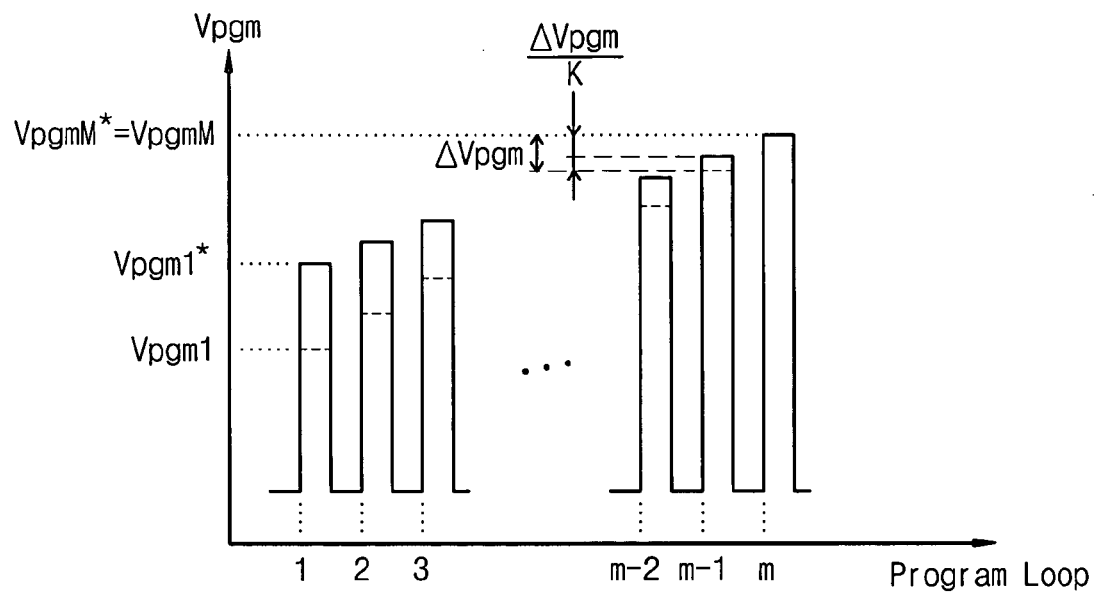
FIGS. 9A and 9B are graphs illustrating a change in a wordline voltage when an increment thereof is changed with a target program voltage remaining unchanged according to an embodiment of the present invention.
Figure 9B:
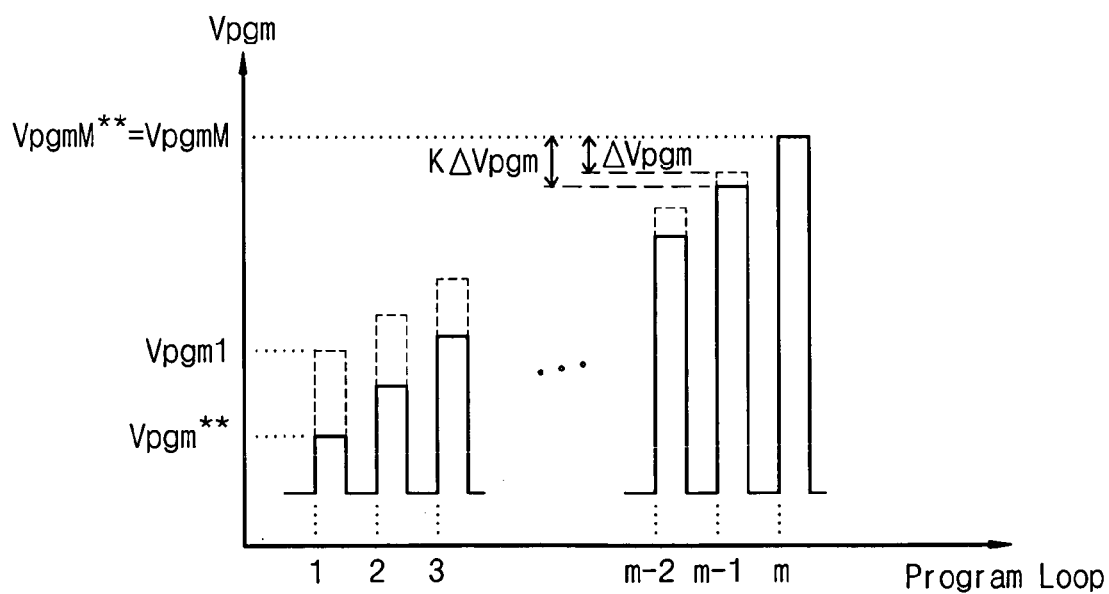

FIGS. 9A and 9B are graphs illustrating a change in a wordline voltage when an increment thereof is changed with the target program voltage remaining unchanged according to an embodiment of the present invention.

Referring to FIG. 9A, a dashed line represents a change in the wordline voltage when the increment ΔVpgm of the program voltage remains unchanged, while a solid line represents a change in the wordline voltage when the increment of the program voltage is reduced from ΔVpgm to ΔVpgm/K (where K is a real number larger than 1). Since the increment of the program voltage decreases, the distribution of the program voltage (e.g., the difference between a height of the start program voltage and a target program voltage) of the programmed memory cell is enhanced. As illustrated in FIG. 9A, since the target program voltage VpgmM* is fixed at VpgmM when the increment of the program voltage is ΔVpgm/K, the under program problem can be substantially prevented.

Referring to FIG. 9B, a dashed line represents a change in the wordline voltage when the increment ΔVpgm of the program voltage remains unchanged, while a solid line represents a change in the wordline voltage when the increment ΔVpgm of the program voltage is increased from ΔVpgm to K×ΔVpgm (where K is a real number larger than 1). Since the increment of the program voltage increases, the memory cell can be more rapidly programmed. As illustrated in FIG. 9B, since the start program voltage VpgmM** is fixed at VpgmM when the increment of the program voltage is K×ΔVpgm, the over program problem can be substantially prevented.

An operation of the nonvolatile memory device 100 will now be described in detail with reference to the accompanying drawings.

In case of the nonvolatile memory device such as the NAND flash memory device, a program cycle includes a plurality of program loops. Each program loop includes a program period and a program verify period. Before the program operation, data to be programmed is loaded into the sense amplifier and latch circuit 130. Thereafter, as a program command is provided to the nonvolatile memory device 100, the program operation is performed. Before the program operation, for example, during the fabrication of the memory device, each of the switch sets is beforehand connected or disconnected. Each of the switch sets includes the fuses or the transistors controlled by the controller 200. The switch set is set before the program operation. The resistances of the first and second circuit units 220a and 220c are predetermined before the program operation, and are not changed during the program cycle.

The control logic 160 activates the program enable signal PGM_EN in response to the received program command, and the wordline voltage generation circuit 190 generates the wordline voltage Vpgm according to the activation of the program enable signal PGM_EN. The program step code STEP0 is activated by the controller 200 during the first program loop. The controller 200 includes the control logic 160, the loop counter 170, and the decoder 180. The program voltage Vpgm is determined, for example, according to Equation 2. When the wordline voltage reaches the desired voltage level of the first program loop, the memory cells are programmed according to the well-known method.

When the program operation of the first program loop ends, the program verify operation is performed. During the program verify operation, the sense amplifier and latch circuit 130 reads data from the memory cell array 110 and outputs the read data to the pass/fail check circuit 150. The pass/fail check circuit 150 determines whether or not the data received from the sense amplifier and latch circuit 130 have the same value. If it is determined that the data received from the sense amplifier and latch circuit 130 have the same value a pass data value is generated. If any one of the received data does not have the pass data value, the control logic 160 activates the count-up signal CNT_UP. The loop counter 170 performs a count-up operation in response to the activation of the count-up signal CNT_UP. The count-up value represents the next program loop. The count-up value is decoded by the decoder 180 to activate the program step code STEP1. The resistance of the second circuit unit 220b in the voltage divider 220 is increased by the program step code STEP1. Accordingly, the wordline voltage Vpgm in the current stage is increased by the increment ΔVpgm in comparison with the wordline voltage Vpgm in the previous stage. The above program operation is repeated until all of the data from the sense amplifier and latch circuit 130 have the pass data value.

The increment ΔVpgm of the wordline voltage can be set to different values by control of the switch sets before the enablement of the wordline voltage generation circuit (e.g., during the fabrication of the memory device) without a change in the program step code. In a case where the resistance of the resistor of each resistor set in the first circuit unit 220a is set to be in direct proportion to the resistance of the corresponding resistor in the third circuit unit 220c, when the increment ΔVpgm of the wordline voltage is changed, the start program voltage Vpgm1 can be maintained. The increment ΔVpgm of the wordline voltage is set to a small value to enhance the program voltage distribution of the programmed memory cell. In this case, the start program voltage Vpgm1 is maintained to substantially prevent the under program problem. Also, the increment ΔVpgm of the wordline voltage is set to a large value to enhance the program speed. In this case, the start program voltage Vpgm1 is maintained to substantially prevent the over program problem.

When the increment ΔVpgm of the wordline voltage is set to different values, the target program voltage VpgmM can be maintained. Unlike the case where the start program voltage Vpgm1 is maintained, the resistances of the resistors in each resistor set are set to have an indirectly-proportional relationship of a function of a variable "m" of the m-th program loop. The target program voltage is maintained, thereby substantially preventing the under program problem or the over program problem that may occur when the increment of the wordline voltage is differently set, for example, when one-bit data is to be stored in the memory cell. When n-bit data is to be stored in the memory cell, it is important to maintain the target program voltage because the program voltage of the programmed memory cell needs to be within a specific range.

According to the present invention, the increment of the wordline voltage can be set to a random value without a change in the program step code.

The start program voltage or the target program voltage can be maintained even when the increment of the wordline voltage is set to a small value so as to enhance the program voltage distribution of the memory cell, thereby making it possible to substantially prevent the under program problem while enhancing the program voltage distribution degree of the memory cell.

The start program voltage or the target program voltage can be maintained even when the increment of the wordline voltage is set to a high value so as to rapidly program the memory cell, thereby making it possible to substantially prevent the over program problem.

It will be apparent to those skilled in the art that various modifications and variations can be made in the present invention. Thus, it is intended that the present invention covers modifications and variations thereof.

What is claimed is:

1. A wordline voltage generation circuit for generating an incremental step pulse voltage, comprising:
 a first circuit unit connected to a program voltage;
 a second circuit unit connected between the first circuit unit and a divided voltage and controlled by a program step code; and
 a third circuit unit connected between the divided voltage and a ground voltage,
 wherein an increment of the program voltage is variable, and wherein the program voltage is set by setting a resistance of the third circuit unit without a change in the program step code.

2. The wordline voltage generation circuit of claim 1, wherein the third circuit unit includes a plurality of resistors connected in series to each other and a plurality of switches respectively connected in parallel to the resistors, and the resistance of the third circuit unit is set by controlling the switches.

3. The wordline voltage generation circuit of claim 1, wherein the third circuit unit includes a plurality of resistors connected in parallel to each other and a plurality of switches respectively connected in series to the resistors, and the resistance of the third circuit unit is set by controlling the switches.

4. The wordline voltage generation circuit of claim 2, wherein the switch is one of a fuse and a transistor.

5. The wordline voltage generation circuit of claim 3, wherein the switch is one of a fuse and a transistor.

6. The wordline voltage generation circuit of claim 1, wherein the increment of the program voltage is determined before a start of a program cycle, and the program voltage is increased by the increment whenever a program loop of the program cycle is repeated.

7. The wordline voltage generation circuit of claim 1, further comprising:
 a charge pump for providing the program voltage to a selected row in response to a clock signal; and
 a charge pump controller for comparing the divided voltage with a reference voltage to generate the clock signal.

8. The wordline voltage generation circuit of claim 1, wherein the first circuit unit is symmetrical in structure to the third circuit unit, and the increment of the program voltage is set to a value by controlling a direct proportional relationship between a resistance of the first circuit unit and a resistance of the third circuit unit, while maintaining a start program voltage at a fixed value without a change in the program step code.

9. The wordline voltage generation circuit of claim 8, wherein the resistance of the each resistor in the first circuit unit is in direct proportion to a resistance of the corresponding resistor in the third circuit, and the each switch in the first circuit unit and the corresponding switch in the third circuit unit are constituted by a set of switches that operate simultaneously.

10. The wordline voltage generation circuit of claim 9, wherein the increment of the program voltage is set by the operation of the switch set while maintaining the start program voltage at the fixed value.

11. The wordline voltage generation circuit of claim 10, wherein the switch is one of a fuse and a transistor.

12. The wordline voltage generation circuit of claim 1, wherein the first circuit unit is symmetrical in structure to the third circuit unit, and the increment of the program voltage is set to a value by controlling an indirect proportional relationship of a function of a variable m of the m-th program loop to be maintained between a resistance of the first circuit unit and a resistance of the third circuit unit, while maintaining a target program voltage at a fixed value without a change in the program step code.

13. The wordline voltage generation circuit of claim 12, wherein a switch in the first circuit unit and a corresponding switch in the third circuit unit operate simultaneously.

14. The wordline voltage generation circuit of claim 13, wherein the increment of the program voltage is set by the operation of the switch in the first circuit unit and the corresponding switch in the third circuit unit set while maintaining the target program voltage at the fixed value.

15. The wordline voltage generation circuit of claim 14, wherein the switch is one of a fuse and a transistor.

16. A nonvolatile memory device using an incremental step pulse programming scheme, comprising:
a wordline voltage generation circuit for generating a wordline voltage in response to program step codes; and
a program controller for sequentially activating the program step codes during a program cycle,
the wordline voltage generation circuit including:
a first circuit unit connected to a program voltage;
a second circuit unit connected between the first circuit unit and a divided voltage and controlled by the program step code; and
a third circuit unit connected between the divided voltage and a ground voltage,
wherein an increment of the program voltage is variable, wherein the increment of the program voltage is set by setting a resistance of the third circuit unit without a change in the program step code.

17. The nonvolatile memory device of claim 16, wherein the third circuit unit includes a plurality of resistors connected in series to each other and a plurality of switches respectively connected in parallel to the resistors, and the resistance of the third circuit unit is set by controlling the switches.

18. The nonvolatile memory device of claim 16, wherein the third circuit unit includes a plurality of resistors connected in parallel to each other and a plurality of switches respectively connected in series to the resistors, and the resistance of the third circuit unit is set by controlling the switches.

19. The nonvolatile memory device of claim 17, wherein the switch is one of a fuse and a transistor.

20. The nonvolatile memory device of claim 18, wherein the switch is one of a fuse and a transistor.

21. The nonvolatile memory device of claim 16, wherein the increment of the program voltage is determined before the start of a program cycle, and the program voltage is increased by the determined increment whenever a program loop of the program cycle is repeated.

22. The nonvolatile memory device of claim 16, wherein the first circuit unit is symmetrical in structure to the third circuit unit, and the increment of the program voltage is set to a value by controlling a direct proportional relationship between a resistance of the first circuit unit and a resistance of the third circuit unit, while maintaining a start program voltage at a fixed value without a change in the program step code.

23. The nonvolatile memory device of claim 22, wherein the resistance of the each resistor in the first circuit unit is in direct proportion to the resistance of the corresponding resistor in the third circuit, and the each switch in the first circuit unit and the corresponding switch in the third circuit unit are simultaneously operated, the each switch and the corresponding switch constituting a switch set.

24. The nonvolatile memory device of claim 23, wherein the increment of the program voltage is set by the operation of the switch set while maintaining the start program voltage at the fixed value.

25. The nonvolatile memory device of claim 23, wherein the switch is one of a fuse and a transistor.

26. The nonvolatile memory device of claim 16, wherein the first circuit unit is symmetrical in structure to the third circuit unit, and the increment of the program voltage is set to a value by controlling an indirect proportional relationship of a function of a variable m of the m-th program loop to be maintained between a resistance of the first circuit unit and a resistance of the third circuit unit, while maintaining a target program voltage at a fixed value without a change in the program step code.

27. The nonvolatile memory device of claim 26, wherein a switch in the first circuit unit and a corresponding switch in the third circuit unit operate simultaneously.

28. The nonvolatile memory device of claim 27, wherein the increment of the program voltage is set by the operation of the switch in the first circuit unit and the corresponding switch in the third circuit unit set while maintaining the target program voltage at the fixed value.

29. The nonvolatile memory device of claim 28, wherein the switch is one of a fuse and a transistor.

30. A nonvolatile memory device using an incremental step pulse programming scheme, comprising:
memory cells arranged in a row-and-column format;
a charge pump for providing a program voltage to a selected row in response to a clock signal;
a voltage divider for dividing the program voltage in response to a program step code; and
a charge pump controller for comparing the divided voltage with a reference voltage to generate the clock signal,
the voltage divider including:
a first circuit unit connected to the program voltage;
a second circuit unit connected between the first circuit unit and a divided voltage and controlled by the program step code; and
a third circuit unit connected between the divided voltage and a ground voltage,
wherein the third circuit unit is symmetrical in structure to the first circuit unit, and an increment of the program voltage is variable.

31. The nonvolatile memory device of claim 30, wherein the increment of the program voltage set to a value by controlling a direct proportional relationship between a resistance of the first circuit unit and a resistance of the third circuit unit, while maintaining a start program voltage at a fixed value without a change in the program step code.

32. The nonvolatile memory device of claim 31, wherein the resistance of the each resistor in the first circuit unit is in direct proportion to the resistance of the corresponding resistor in the third circuit, and each switch in the first circuit unit and a corresponding switch in the third circuit unit operate simultaneously.

33. The nonvolatile memory device of claim 32, wherein the switch is one of a fuse and a transistor.

34. The nonvolatile memory device of claim 31, wherein the memory cells each includes one of a single-level memory cell for storing one-bit data and a multi-level memory cell for storing n-bit data, wherein n is an integer equal to or larger than 2.

35. The nonvolatile memory device of claim 30, wherein the increment of the program voltage is set to a value by controlling an indirect proportional function relationship to be maintained between a resistance of the first circuit unit and a resistance of the third circuit unit, while maintaining a target program voltage at a fixed value without a change in the program step code.

36. A wordline voltage generation circuit for generating an incremental step pulse voltage, comprising:
    a first circuit unit connected to a program voltage,
    a second circuit unit connected between the first circuit unit and a divided voltage and controlled by a program step code; and
    a third circuit unit connected between the divided voltage and a ground voltage,
    wherein an increment of the program voltage is variable, wherein the increment of the program voltage is determined before a start of a program cycle, and the program voltage is increased by the increment whenever program loop of the program cycle is repeated.

* * * * *